United States Patent
Irsigler et al.

(10) Patent No.: US 9,761,548 B1
(45) Date of Patent: Sep. 12, 2017

(54) BOND PAD STRUCTURE

(71) Applicant: Infineon Technologies AG, Neubiberg (DE)

(72) Inventors: Peter Irsigler, Obernberg am Inn (AT); Martina Seider-Schmidt, Munich (DE); Sebastian Schmidt, Munich (DE); Oliver Hellmund, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/159,006

(22) Filed: May 19, 2016

(51) Int. Cl.
*H01L 21/04* (2006.01)
*H01L 23/00* (2006.01)

(52) U.S. Cl.
CPC ............. *H01L 24/05* (2013.01); *H01L 24/03* (2013.01); *H01L 2224/04042* (2013.01); *H01L 2224/05082* (2013.01); *H01L 2224/05124* (2013.01); *H01L 2224/05139* (2013.01); *H01L 2224/05144* (2013.01); *H01L 2224/05147* (2013.01); *H01L 2224/05164* (2013.01); *H01L 2224/05166* (2013.01); *H01L 2224/05169* (2013.01); *H01L 2224/05171* (2013.01); *H01L 2224/05184* (2013.01); *H01L 2224/05187* (2013.01); *H01L 2924/13055* (2013.01); *H01L 2924/13091* (2013.01); *H01L 2924/351* (2013.01)

(58) Field of Classification Search
None
See application file for complete search history.

(56) References Cited

U.S. PATENT DOCUMENTS

| | | | | |
|---|---|---|---|---|
| 5,633,196 A * | 5/1997 | Zamanian | ............... | H01L 21/28 257/E21.158 |
| 5,734,200 A * | 3/1998 | Hsue | ...................... | H01L 24/03 257/751 |
| 5,834,365 A * | 11/1998 | Ming-Tsung | ........... | H01L 24/03 257/E23.02 |
| 6,384,467 B1 * | 5/2002 | Mitchell | ........... | H01L 21/02129 257/324 |
| 6,403,414 B2 * | 6/2002 | Marsh | ................. | H01L 21/3065 257/E21.218 |
| 6,426,556 B1 * | 7/2002 | Lin | ......................... | H01L 24/03 257/738 |
| 6,812,578 B2 * | 11/2004 | Kim | .................... | H01L 23/3114 257/754 |

(Continued)

*Primary Examiner* — Michael Lebentritt
(74) *Attorney, Agent, or Firm* — Dicke, Billig & Czaja, PLLC (57) ABSTRACT

A bond pad structure includes a first oxide layer that overlies a substrate. A plurality of adhesion structures are formed over the first oxide layer. A second oxide layer is formed over the plurality of adhesion structures and the first oxide layer. Each one of a plurality of contact openings formed within a surface region of the second oxide layer includes one or more sides and is aligned over at least a portion of a top surface of a corresponding one of the plurality of adhesion structures. A barrier layer is formed within the surface region that is over the second oxide layer and within the plurality of contact openings and over the at least a portion of the top surface of the corresponding ones of the plurality of adhesion structures. A metal layer is formed over the barrier layer.

16 Claims, 6 Drawing Sheets

(56) References Cited

U.S. PATENT DOCUMENTS

| | | | |
|---|---|---|---|
| 8,034,685 B1* | 10/2011 | Venkatraman | H01L 29/407 438/270 |
| 2001/0036716 A1* | 11/2001 | Chittipeddi | H01L 24/03 438/584 |
| 2001/0051426 A1* | 12/2001 | Pozder | H01L 24/03 438/666 |
| 2003/0036256 A1* | 2/2003 | Efland | H01L 24/03 438/613 |
| 2003/0166334 A1* | 9/2003 | Lin | H01L 24/05 438/627 |
| 2005/0017361 A1* | 1/2005 | Lin | H01L 23/5222 257/756 |
| 2005/0074966 A1* | 4/2005 | Rhodes | H01L 21/76816 438/629 |
| 2005/0127530 A1* | 6/2005 | Fan | H01L 24/03 257/786 |
| 2006/0003547 A1* | 1/2006 | Kobrinsky | H01L 21/76885 438/455 |
| 2007/0004230 A1* | 1/2007 | Johnston | H01L 21/02074 438/785 |
| 2007/0284726 A1* | 12/2007 | Lin | H01L 23/525 257/698 |
| 2008/0042280 A1* | 2/2008 | Lin | H01L 23/53238 257/751 |
| 2010/0155893 A1* | 6/2010 | Chen | H01C 7/006 257/537 |
| 2012/0080795 A1* | 4/2012 | Dallmann | H01L 21/76831 257/762 |
| 2012/0293587 A1* | 11/2012 | Bakker | B41J 2/14129 347/63 |
| 2013/0015850 A1* | 1/2013 | Lindorfer | G01R 33/032 324/244 |
| 2013/0075907 A1* | 3/2013 | Pang | H01L 24/11 257/741 |
| 2014/0363968 A1* | 12/2014 | Yang | B81C 1/0023 438/624 |
| 2016/0190089 A1* | 6/2016 | Yu | H01L 24/81 438/107 |

\* cited by examiner

BOND PAD STRUCTURE

FIELD OF TECHNOLOGY

The present application relates to a bond pad structure, in particular, a bond pad structure that includes a plurality of adhesion structures.

BACKGROUND

Semiconductor manufacturers are continuously working to improve the performance and reliability of power devices such as double diffused metal oxide semiconductor (DMOS) and insulated gate bipolar transistor (IGBT) devices. One of the areas of concern is adhesion failure of the bond pads for the power device die. The bond pads are located on a top surface of the die and include a metal layer that is formed over a thick oxide or field oxide region of the die. The bond pads are wire bonded to inner leads of a package lead frame to form electrical contacts between the bond pads and the package lead frame.

One approach that has been used to address the issue of adhesion failure is to form a layer of polysilicon that is between the metal layer and the field oxide. The polysilicon layer provides a chemically compatible interface between the metal layer and the field oxide thereby improving adhesion. The polysilicon layer absorbs external thermo-mechanical stress and improves durability against stress in a vertical direction relative to a surface of the metal layer. The field oxide however can have defects caused during formation that are areas of localized thinning that are randomly distributed throughout the field oxide. Power devices typically operate at high voltage levels, such as 250 V to much higher than 1000 V. Having the polysilicon layer in direct contact with these defect areas when a high voltage level is applied to the bond pad metal layer during operation can result in a high current or short circuit condition that will destroy the power device. The adhesion and stress absorption benefits of using polysilicon over the relatively large surface areas required for bond pads can be offset by the random distribution of the localized thinning defects and the increased probability of a high current condition occurring that can destroy the power device Another approach is to form the metal layer directly over the field oxide. Metals such as aluminum have good adhesion to silicon and to silicon oxides such as $SiO_2$. To avoid diffusion of silicon into the aluminum, silicon must be added to the aluminum layer. Because the addition of silicon to the aluminum metal layer can result in problems such as silicon grain growth, another approach is to use a diffusion barrier between the aluminum metal layer and the $SiO_2$ field oxide. Diffusion barrier layers such as a titanium (Ti), titanium nitride (TiN) or titanium tungsten (TiW) are effective at preventing the diffusion of silicon into the aluminum metal layer. Barrier layers formed from Ti/TiN or TiW however tend to have poor adhesion to $SiO_2$. Due to the relatively large area of the $SiO_2$ field oxide needed for the bond pad metal and barrier layers, and the different thermal expansion properties of the material layers used to form the bond pad, lateral stress in a direction parallel to the surface of the band pad can result in peeling or separation of the bond pad material layers from the $SiO_2$ field oxide.

SUMMARY

According to an embodiment of a bond pad structure, the bond pad structure includes a first oxide layer that overlies a substrate. A plurality of adhesion structures are formed over the first oxide layer. A second oxide layer is formed over the plurality of adhesion structures and the first oxide layer. Each one of a plurality of contact openings formed within a surface region of the second oxide layer includes one or more sides and is aligned over at least a portion of a top surface of a corresponding one of the plurality of adhesion structures. A barrier layer is formed within the surface region that is over the second oxide layer and within the plurality of contact openings and over at least a portion of the top surface of the corresponding ones of the plurality of adhesion structures. A metal layer is formed over the barrier layer.

According to an embodiment of a bond pad structure, the bond pad structure includes a plurality of recesses arranged within a surface region of an oxide layer that overlies a substrate. Each one of the plurality of recesses includes one or more sides and a bottom that is at a depth below a surface of the oxide layer. An adhesion layer is formed over the bottom of the plurality of recesses and has a thickness that is less than the depth. A barrier layer is formed over the surface region and within the plurality of recesses and over the adhesion layer. A metal layer is formed over the barrier layer.

According to an embodiment of a method of forming a bond pad structure, the method includes forming a first oxide layer over a substrate. The method includes forming a plurality of adhesion structures over the first oxide layer. The method includes forming a second oxide layer over the plurality of adhesion structures and the first oxide layer. The method includes forming a plurality of contact openings within a surface region of the second oxide layer. Each one of the plurality of contact openings includes one or more sides and is aligned over at least a portion of a top surface of a corresponding one of the plurality of adhesion structures. The method includes forming a barrier layer within the surface region that is over the second oxide and within the plurality of contact openings and over at least a portion of the top surface of the corresponding ones of the plurality of adhesion structures. The method includes forming a metal layer over the barrier layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
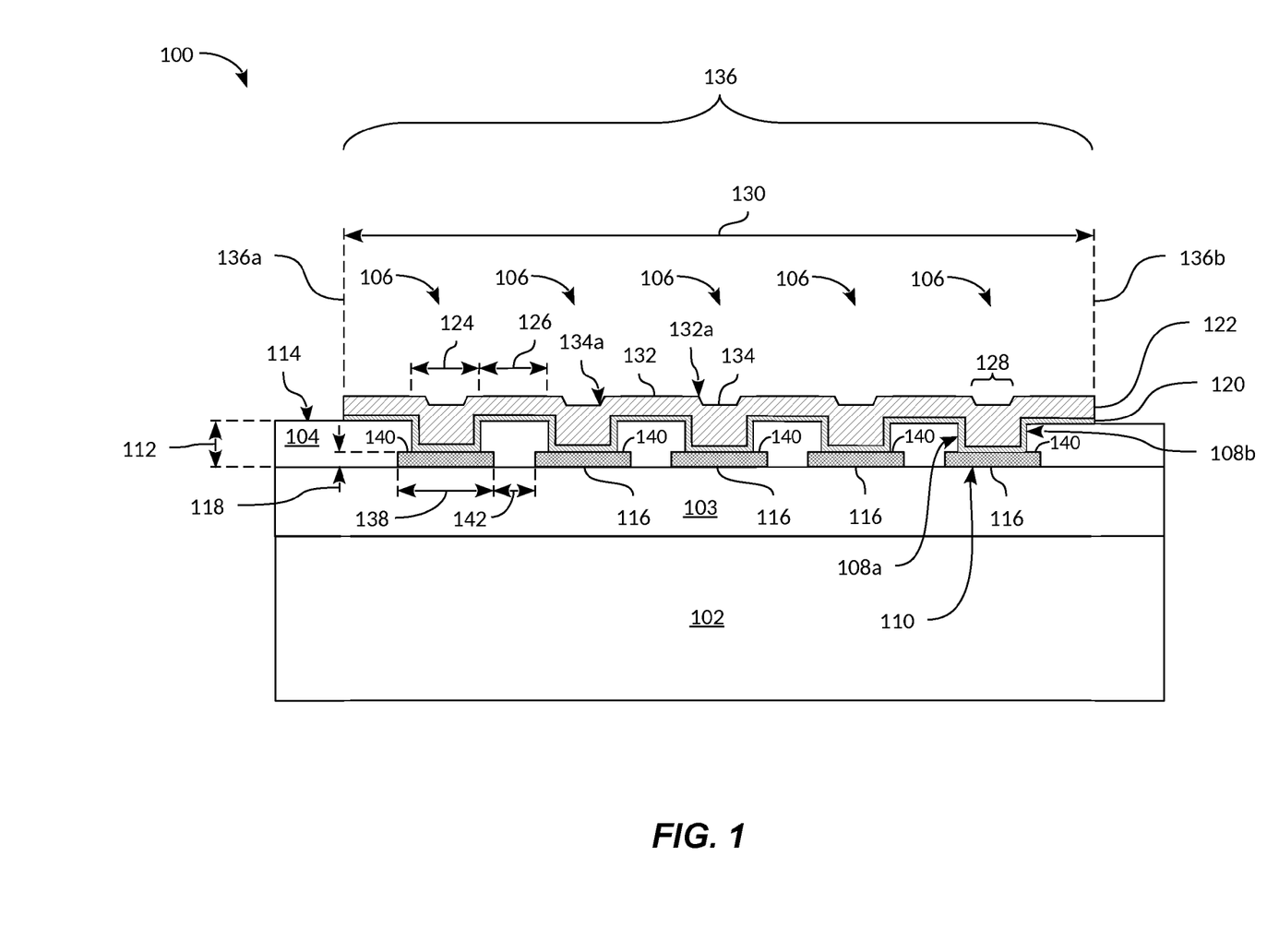
FIG. 1 illustrates a cross-sectional view of an embodiment of a bond pad structure.
Figure 4:
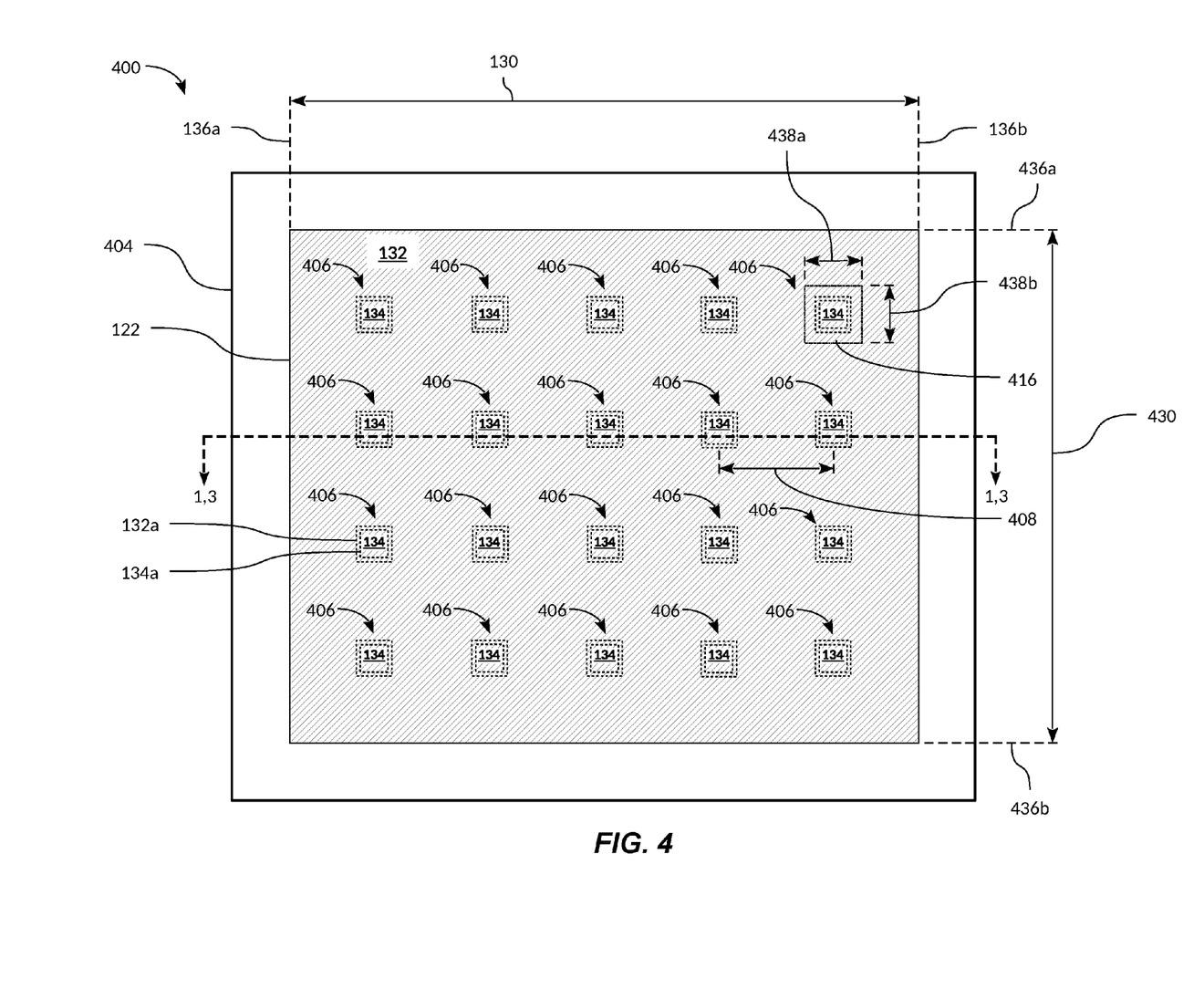
FIG. 4 illustrates a top plan view of an embodiment of a bond pad structure.

FIG. 1 illustrates a cross-sectional view of an embodiment of a bond pad structure at 100. A top plan view of bond pad structure 100 is illustrated in FIG. 4 as a dashed line that references FIG. 1. In the illustrated embodiment, bond pad structure 100 is formed over a substrate 102. In one embodiment, substrate 102 is a silicon (Si) substrate. In other embodiments, substrate 102 can be formed from other suitable materials that include, but are not limited to, Silicon Germanium (SiGe), Silicon on Insulator (SOI), Silicon Carbide (SiC) and Gallium Arsenide (GaAs). In the illustrated embodiment, a first oxide layer 103 is formed over substrate 102. In one embodiment, oxide layer 103 is formed from silicon dioxide ($SiO_2$). In other embodiments, oxide layer 103 can be formed from other suitable materials and processes that include, but are not limited to, a Tetraethyl Orthosilicate (TEOS) oxide, silicon nitride ($Si_3N_4$), silicon carbide (SiC), silicon oxynitride (SiON), boron phosphor silicate glass (BPSG), as well as any combination or derivative of these materials.

In the illustrated embodiment, a plurality of adhesion structures 116 are formed over first oxide layer 103. In one embodiment, the adhesion structures 116 are formed from polysilicon. In other embodiments, the adhesion structures 116 can be formed from other suitable materials. In the illustrated embodiment, the adhesion structures 116 have a width illustrated at 138 and a thickness illustrated at 118. A bottom surface of the adhesion structures 116 that is in contact with oxide layer 103 is illustrated at 110. Each one of the plurality adhesion structures 116 is spaced apart by a distance 142 in a first direction 130 from adjacent ones of the plurality of adhesion structures 116. In other embodiments, each one of the plurality of adhesion structures 116 is spaced apart by a distance from adjacent ones of the plurality of adhesion structures 116 in two or more directions (see also, FIG. 4).

In the illustrated embodiment, a second oxide layer 104 is formed over the adhesion structures 116 and first oxide layer 103. In one embodiment, second oxide layer 104 is formed from $SiO_2$. In other embodiments, oxide layer 104 can be formed from other suitable materials and processes that include, but are not limited to, a TEOS oxide, $Si_3N_4$, SiC, SiON, BPSG, as well as any combination or derivative of these materials. In the illustrated embodiment, a plurality of contact openings 106 are formed within a surface region 136 of second oxide layer 104. Surface region 136 is defined in FIG. 1 as a distance between dashed line 136a and dashed line 136b in first direction 130. Each contact opening 106 includes one or more sides 108 (illustrated at 108a and 108b) and is aligned over at least a portion of top surface 140 of a corresponding adhesion structure 116 as illustrated in FIG. 1. Each contact opening 106 has a depth 112 that is below surface 114 of oxide layer 104.

In the illustrated embodiment, a barrier layer 120 is formed within surface region 136. In one embodiment, barrier layer 120 is a conformal barrier layer 120. In the illustrated embodiment, barrier layer 120 is formed over surface 114 of the second oxide layer 104, and is formed within the plurality of contact openings 106 and over at least a portion of top surface 140 of corresponding adhesion structures 116. Barrier layer 120 can be formed from any suitable material or any combination of suitable materials that includes, but is not limited to, titanium (Ti), titanium nitride (TiN), tungsten (W), titanium tungsten (TiW), tantalum (Ta), tantalum nitride (TaN), titanium silicon nitride (TiSiN), tantalum silicon nitride (TaSiN), tungsten nitride (WN), Niobium (Nb), molybdenum (Mo), molybdenum nitride (MoN), chromium (Cr), cobalt (Co), nickel (Ni), palladium (Pd) and platinum (Pt). In other embodiments, other suitable materials or combinations of suitable materials may be used. In other embodiments, barrier layer 120 includes two or more layers of suitable materials. For example, in one embodiment, barrier layer 120 is formed from Ti and TiN and is a Ti/TiN barrier layer.

In the illustrated embodiment, a metal layer 122 is formed over barrier layer 120. In one embodiment, metal layer 122 is a conformal metal layer 122. In one embodiment, metal layer 122 is a pad metal that is used for the attachment of bond wires. Metal layer 122 can be formed from any suitable material or alloys of materials that include, but is not limited to, aluminum (Al), gold (Au), silver (Ag), copper (Cu), tungsten (W), chromium (Cr), titanium (Ti), platinum (Pt) or palladium (Pd). In other embodiments, metal layer 122 can be formed from other suitable materials or combinations of materials.

In the illustrated embodiment, metal layer 122 has a structured surface 128 that conforms to the plurality of contact openings 106 on surface 114 of oxide layer 104. The structured surface 128 is illustrated in FIG. 1 by the variation of the surface level of metal layer 122 between surface area 132 and surface area 134. Surface area 132 has edges illustrated at 132a. Surface area 134 has edges illustrated at 134a. Surface areas 132 are between adjacent ones of the plurality of contact openings 106, and surface areas 134 are over and/or within each one of the plurality of contact openings 106. Although metal layer 122 is illustrated in FIG. 1 as having surface areas 134 that are above surface 114, in other embodiments, surface areas 134 can be below surface 114 of second oxide 104. In various embodiments, whether surface areas 134 are above or below surface 114 of oxide layer 104 can depend in part on the dimensions of the plurality of contact openings 106 as indicated by width 124 and depth 112. A spacing between adjacent ones of the plurality of contact openings 106 is indicated by spacing 126. In the illustrated embodiment, height 112, width 124 and spacing 126 for contact openings 106 and height 118, width 138 and spacing 142 for adhesion structures 142 are the same for the contact openings 106 and adhesion structures 142 illustrated in FIG. 1. In other embodiments, one or more of height 112, width 124, spacing 126, height 118, width 138 and spacing 142 can vary between different ones of either or both of the contact openings 106 and adhesion structures 142. For example, in one embodiment, height 112 and height 118 are the same for each one of the plurality of contact openings 106 and corresponding adhesion structures 106, while width 124, spacing 126, width 138 and spacing 142 can vary for different ones of the plurality of contact openings 106 and corresponding adhesion structures 116.

In the illustrated embodiments, adhesion structures 116 provide excellent adhesion between metal layer 122 and oxide 103 in a vertical direction relative to a surface of metal layer 122. Spacing 142 introduces a break between adjacent adhesion structures 116 thereby reducing the overall amount of contact area between bottoms 110 of adhesion structures 116 and oxide 103. Reducing the contact area reduces the probability of random defects within oxide 103 causing current-induced failure of bond pad structure 100.

In the illustrated embodiments, structured surface 128 of metal layer 122 results from the variation of the surface level of metal layer 122 between surface areas 132 and surface areas 134. This variation is between adjacent edges 132a and 134a of adjacent surface areas 132 and 134 and operates to release stress between barrier layer 120 and oxide layer 104 in a lateral or parallel direction relative to the surface of metal layer 122. The structured surface 128 of metal layer 122 restricts the lateral stress to distance 126 between adjacent contact openings 106 due to the introduction of stress breaking edges caused by the transition between surface areas 132 and surface areas 134. Load-induced or stress-induced tendencies that result, for example, from the different coefficients of thermal expansion for metal layer 122, barrier layer 120 and oxide layer 104, are suppressed in a controlled manner to improve bond pad reliability and reduce the likelihood of failure of bond pad structure 100 due to thermal or mechanical stresses.

Figure 2:
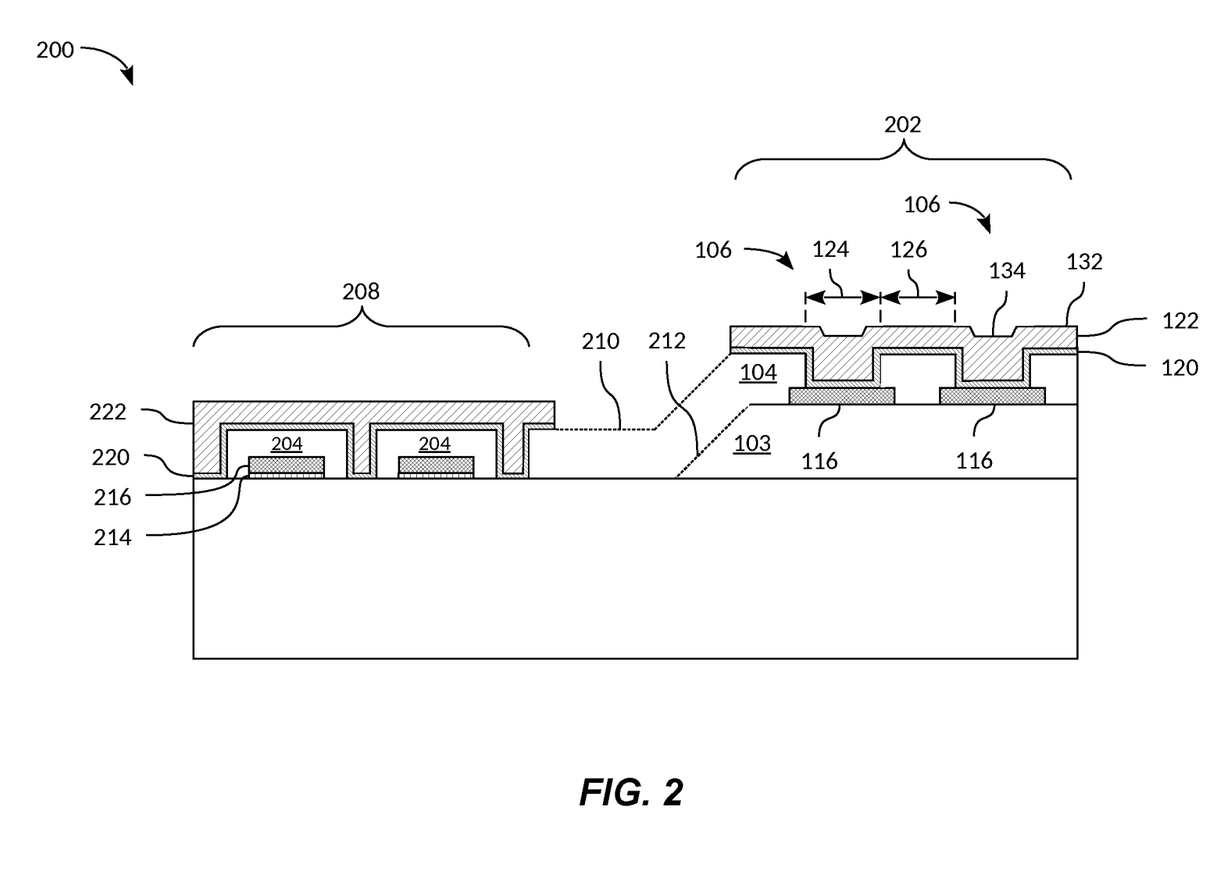
FIG. 2 illustrates a partial cross-sectional view of an embodiment of a power device that includes a bond pad structure.

FIG. 2 illustrates a partial cross-sectional view of an embodiment of a power device at 200 that includes a bond pad structure 202 and a power device 208. In various embodiments, the power device 208 can be a power MOSFET such as a double diffused metal oxide semiconductor (DMOS) device, an insulated gate bipolar transistor (IGBT) device or other suitable type of power device. FIG. 2 illustrates the portion of power device 208 that is above substrate 102. In various embodiments, power devices such as power MOSFETs and IGBTs have similar cross-sections above substrate 102 and include a gate 216 that is formed over a gate oxide 214, an oxide 204, a barrier layer 220 and a metal layer 222. In an exemplary embodiment, power device 208 is an IGBT and metal layer 222 is an emitter contact metal layer. In another exemplary embodiment, power device 208 is a power MOSFET and metal layer 222 is a source contact metal layer. In other embodiments, metal layer 222 can form other suitable types of metal contact layers for power device 208.

In the illustrated embodiment, bond pad structure 202 includes adhesion structures 116 and power device 208 includes gates 216. In one embodiment, adhesion structures 116 and gates 216 are both formed from polysilicon. In one embodiment, adhesion structures 116 and gate 216 are both formed from polysilicon and are formed from a same polysilicon layer. In one embodiment, adhesion structures 116 and gates 216 are both formed from polysilicon and are defined within a same lithography mask. In this embodiment, the lithography mask includes a first feature set to define gates 216 and a second feature set to define adhesion structures 116. In one embodiment, the second feature set that defines adhesion structures 116 is defined automatically by a pattern generator during generation of the lithography mask. In one embodiment, bond pad structure 202 is a gate bond pad and adhesion structures 116 and gate 216 are formed from a same polysilicon layer. In other embodiments, adhesion structures 116 and gates 216 can be formed using different semiconductor process steps.

In the illustrated embodiment, the dashed lines at 210 and 212 illustrate boundaries of oxide 104 and/or oxide 204 between bond pad structure 202 and power device 208. In one embodiment, oxide 104 for bond pad structure 202 and oxide 204 for power device 208 are formed from a same oxide layer. In one embodiment, oxide 104 for bond pad structure 202 and oxide 204 for power device 208 are defined within a same lithography mask. In this embodiment, the lithography mask includes a first feature set to define oxide 204 and a second feature set to define oxide 104. In one embodiment, the second feature set that defines oxide 104 is defined automatically by a pattern generator during generation of the lithography mask. In other embodiments, oxide 104 and oxide 204 can be formed using different semiconductor processing steps.

Figure 3:
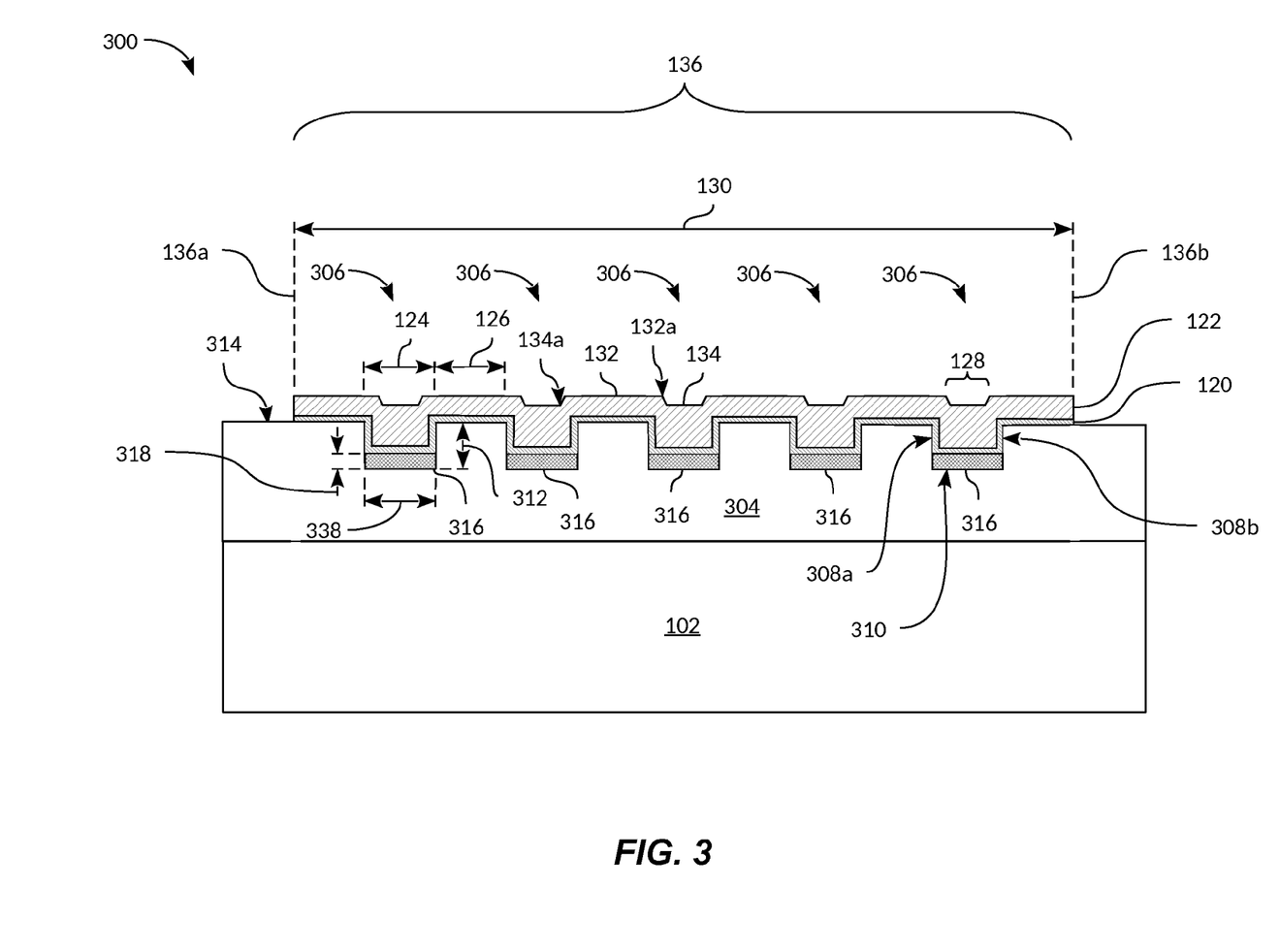
FIG. 3 illustrates a cross-sectional view of an embodiment of a bond pad structure.

FIG. 3 illustrates a cross-sectional view of an embodiment of a bond pad structure at 300. A top plan view of bond pad structure 300 is illustrated in FIG. 4 as a dashed line that references FIG. 3. In the illustrated embodiment, an oxide layer 304 is formed over substrate 102. In one embodiment, oxide layer 304 is formed from $SiO_2$. In other embodiments, oxide layer 304 can be formed from other suitable materials and processes that include, but are not limited to, a TEOS oxide, $Si_3N_4$, SiC, SiON and BPSG. In other embodiments, other suitable materials or combinations of suitable materials may be used. In the illustrated embodiment, a plurality of recesses 306 are arranged within a surface region 136 of oxide layer 304. Each one of the plurality of recesses 306 are spaced apart in a first direction 130 from adjacent ones of the plurality of recesses 306. Each one of the plurality of recesses 306 includes one or more sides 308 (illustrated at 308a and 308b) and a bottom 310. Bottom 310 is at a depth 312 below a surface 314 of oxide layer 304.

In the illustrated embodiment, an adhesion layer 316 is formed over the bottom 310 of the plurality of recesses 306. In one embodiment, adhesion layer 316 is formed from polysilicon. In other embodiments, adhesion layer 316 can be formed from other suitable materials. In the illustrated embodiment, adhesion layer 316 has a thickness 318 that is less than depth 312. In other embodiments, adhesion layer 316 can have a thickness that is greater than depth 312. In other embodiments, adhesion layer 316 can be formed over part of, or over all of, surface 314 of oxide layer 304.

In the illustrated embodiment, a barrier layer 120 is formed over surface region 136 and within the plurality of recesses 306 and over adhesion layer 316. In one embodiment, barrier layer 120 is a conformal barrier layer 120. In the illustrated embodiment, barrier layer 120 can be formed from any suitable material or any combination of suitable materials that includes, but is not limited to, Ti, TiN, W, TiW, Ta, TaN, TiSiN, TaSiN, WN, Nb, Mo, MoN, Cr, Co, Ni, Pd and Pt. In other embodiments, other suitable materials or combinations of suitable materials may be used. In other embodiments, barrier layer 120 includes two or more layers of suitable materials. For example, in one embodiment, barrier layer 120 is formed from Ti and TiN and is a Ti/TiN barrier layer.

In the illustrated embodiment, a metal layer 122 is formed over barrier layer 120. In one embodiment, metal layer 122 is a conformal metal layer 122. In one embodiment, metal layer 122 is a pad metal that is used for the attachment of bond wires. Metal layer 122 can be formed from any suitable material or alloys of materials that includes, but is not limited to, Al, Au, Ag, Cu, W, Cr, Ti, Pt and Pd. In other embodiments, metal layer 122 can be formed from other suitable materials.

In the illustrated embodiment, metal layer 122 has a structured surface 128 that conforms to the plurality of recesses 306 on surface 314 of oxide layer 304. The structured surface 128 is illustrated in FIG. 3 by the variation of the surface level of metal layer 122 between surface area 132 and surface area 134. Surface areas 132 are between adjacent ones of the plurality of recesses 306, and surface areas 134 are over or within each one of the plurality of recesses 306. Although metal layer 122 is illustrated as having surface areas 134 that are above surface 314, in other embodiments, surface areas 134 can be below surface 314.

In the illustrated embodiment, a spacing between adjacent ones of the plurality of recesses 306 is indicated at 126. Each recess 306 has a height 312 and a width 124. In the embodiment illustrated in FIG. 3, width 124 is equal to width 338 of adhesion layer 316. In other embodiments, width 338 of adhesion layer 316 can be less than width 124. In the illustrated embodiment, height 312, width 124 and spacing 126 for recesses 306, and thickness 318 and width 338 for adhesion layer 316 are the same for the recesses 306 and adhesion structures 142 illustrated in FIG. 3.

In other embodiments, one or more of height 312, width 124, spacing 126, thickness 318 and width 338 can vary between different ones of the recesses 306 and adhesion layers 316. For example, in one embodiment, height 312 and thickness 318 are the same for each one of the recesses 306 and corresponding adhesion layers 316, while width 124 and spacing 126 can vary for different ones of the plurality of recesses 306 and corresponding adhesion structures 316.

FIG. 4 illustrates a top plan view of an embodiment of a bond pad structure at 400. The top plan view illustrated in FIG. 4 is a top plan view of bond pad 100 illustrated in FIG. 1 and of bond pad 300 illustrated in FIG. 3. Bond pad 400 includes a metal layer 122 that includes surface area 132 and surface areas 134. Surface area 132 has edges illustrated at 132a and surface areas 134 have edges illustrated at 134a. Referring to FIG. 4 and FIG. 1, oxide layer 404 corresponds to oxide layer 104, structures 406 correspond to contact openings 106, width 438a corresponds to width 138 and adhesion structures 416 corresponds to adhesion structures 116. Referring to FIG. 4 and FIG. 3, oxide layer 404 corresponds to oxide layer 304, structures 406 correspond to recesses 306, width 438a corresponds to width 338, and adhesion structures 416 corresponds to adhesion layers 316.

In the embodiment illustrated in FIG. 4, an area of the surface region is equal to a surface area of metal layer 122. A first distance is measured between dashed line 136a and dashed line 136b in first direction 130 (e.g., 136a-136b). A second distance is measured between dashed line 436a and dashed line 436b in a second direction 430 (e.g., 436a-436b). The area of the surface region of bond pad 400 is equal to a product of the first distance (136a-136b) and the second distance (436a-436b).

In the embodiment illustrated in FIG. 4, a bottom surface contact area between adhesion structure 416 and oxide layer 103 (refer to FIG. 1), or between adhesion structure 416 and a bottom 310 of recess 306 within oxide layer 304 (refer to FIG. 3), is equal to a product of width 438a and width 438b. Multiplying width 438a by width 438b provides an area for an adhesion structure 416. FIG. 4 includes a plurality of adhesion structures 416 that are spaced apart at a distance from adjacent adhesion structures 416 in both first direction 130 and second direction 430. First direction 130 and second direction 430 are parallel to the surface region. FIG. 4 illustrates 20 adhesion structures 416 that are within the area of the surface region of bond pad 400. A total bottom surface contact area for the 20 adhesion structures 416 is equal to a product of width 438a and width 438b that is multiplied by 20.

In the illustrated embodiments, adhesion structures 416 provide excellent adhesion for metal layer 122 of bond pad structure 400 in a vertical direction relative to a surface 132 of metal layer 122. Reducing the total bottom contact surface area for adhesion structures 416 reduces the probability of random defects causing a current-induced failure of bond pad structure 400. The structured surface 128 due to edges 132a and 134a of surface areas 132 and 134 for each structure 406 operates to restrict lateral stress in a direction parallel to surface 132 to be between adjacent structures 406. Increasing the number of structures 406 within the surface region of bond pad 400 increases the benefit of lateral stress reduction.

For the illustrated embodiments, it was determined through experimental data that an optimal ratio of the area of the surface region of bond pad 400 to a total bottom contact surface area for adhesion structures 416 is within a range of about 3 to about 1000. In another embodiment, the optimal ratio of the area of the surface region of bond pad 400 to a total bottom contact surface area for adhesion structures 416 is within a range of 4 to 625. In other embodiments, the optimal ratio of the area of the surface region of bond pad 400 to the total bottom contact surface area for adhesion structures 416 can have other suitable ranges, maximums or minimums.

In one exemplary embodiment, the total bottom contact surface area for the 20 adhesion structures 416 illustrated in FIG. 4 is 80 $\mu m^2$ when the bottom surface contact area for each adhesion structure 416 is 4 $\mu m^2$ (e.g., when width 438a is 2 $\mu m$ and width 438b is 2 $\mu m$). The surface region of bond pad 400 is 50,000 $\mu m^2$ when first distance (136a-136b) is 250 $\mu m$ and second distance (436a-436b) is 200 $\mu m$. The ratio of the area of the surface region of bond pad 400 to a total bottom contact surface area for adhesion structures 416 is equal to 625. The ratio of 625 is within the optimal ratio range of about 3 to about 1000 as discussed above.

In other embodiments, the ratio of the area of the surface region of bond pad 400 to a total bottom contact surface area for adhesion structures 416 can be determined from the cross-sectional view of bond pad 100 illustrated in FIG. 1 or from the cross-sectional view of bond pad 300 illustrated in FIG. 3. A pitch between adjacent structures 406 is illustrated in FIG. 4 at 408.

Referring to FIG. 1, pitch 406 corresponds to a sum of width 138 and spacing 142 between adjacent adhesion structures 116 and width 438a corresponds to width 138. In one exemplary embodiment, the sum of width 138 and spacing 142 is 50 $\mu m$ and width 138 is 2 $\mu m$. Assuming the relative dimensions illustrated in FIG. 4 (e.g., width 438a is equal to width 438b and pitch 408 is the same in both first direction 130 and second direction 430), the surface region for one adhesion structure 116 is equal to the sum of width 138 and spacing 142 (50 $\mu m$) multiplied by 50 $\mu m$, and the bottom contact surface area of bottom 110 of adhesion structure 116 is equal to width 138 (2 $\mu m$) multiplied by 2 $\mu m$. The ratio is equal to 2500 $\mu m^2$ divided by 4 $\mu m^2$ which is 625. The ratio of 625 is within the optimal ratio range of about 3 to about 1000 as discussed above.

Referring to FIG. 3, pitch 406 corresponds to a sum of width 124 and spacing 126 between adjacent adhesion layers 316 that are over the bottoms 310 of recesses 306 and width 438a corresponds to width 124. In one exemplary embodiment, the sum of width 124 and spacing 126 is 50 $\mu m$ and width 124 is 2 $\mu m$. Assuming the relative dimensions illustrated in FIG. 4 (e.g., width 438a is equal to width 438b and pitch 408 is the same in both first direction 130 and second direction 430), the surface region for one adhesion layer 316 is equal to the sum of width 124 and spacing 126 (50 $\mu m$) multiplied by 50 $\mu m$ and the bottom contact surface area at bottom 310 of adhesion layer 316 is equal to width 124 (2 $\mu m$) multiplied by 2 $\mu m$. The ratio is equal to 2500 $\mu m^2$ divided by 4 $\mu m^2$ which is 625. The ratio of 625 is within the optimal ratio range of about 3 to about 1000 as discussed above.

Figure 5A:
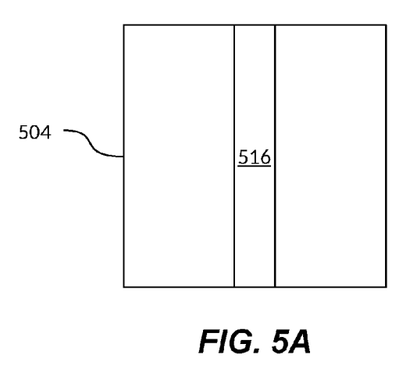
FIGS. 5A-5D illustrate top plan views, respectively, of embodiments of adhesion structures within an oxide layer.
Figure 5B:
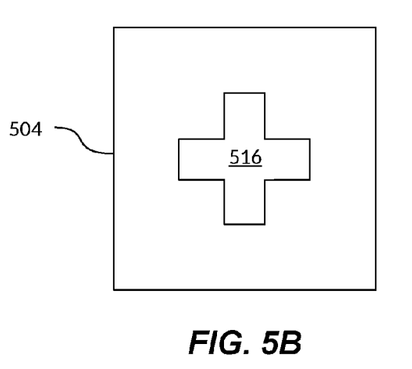
Figure 5C:
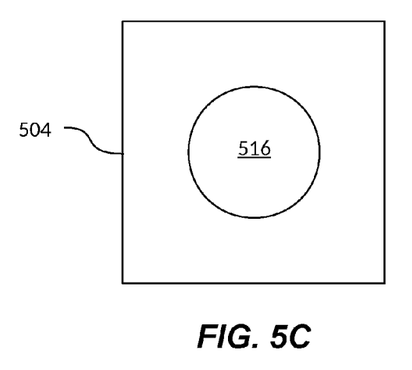
Figure 5D:
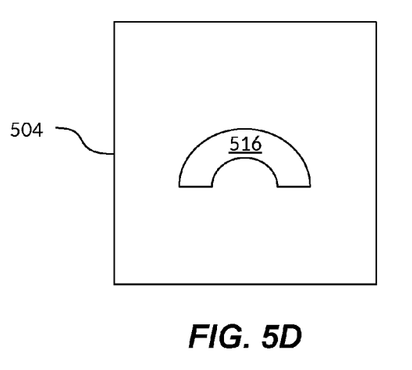

FIGS. 5A-5D illustrate top plan views, respectively, of embodiments of adhesion structures 516 within an oxide layer. Adhesion structures 516 in FIGS. 5A-5D correspond to embodiments of adhesion structures 116, adhesion layers 316 and adhesion structures 416. Oxide layer 504 corresponds to embodiments of oxide layer 104, oxide layer 304 and oxide layer 404. FIG. 5A illustrates adhesion structure 516 as a trench structure. FIG. 5B illustrates adhesion structure 516 as a cross structure. FIG. 5C illustrates adhesion structure 516 as a circle structure. FIG. 5D illustrates adhesion structure 516 as an arc structure. In other embodiments, adhesion structures 516 can have any suitable shape or dimensions.

Figure 6:
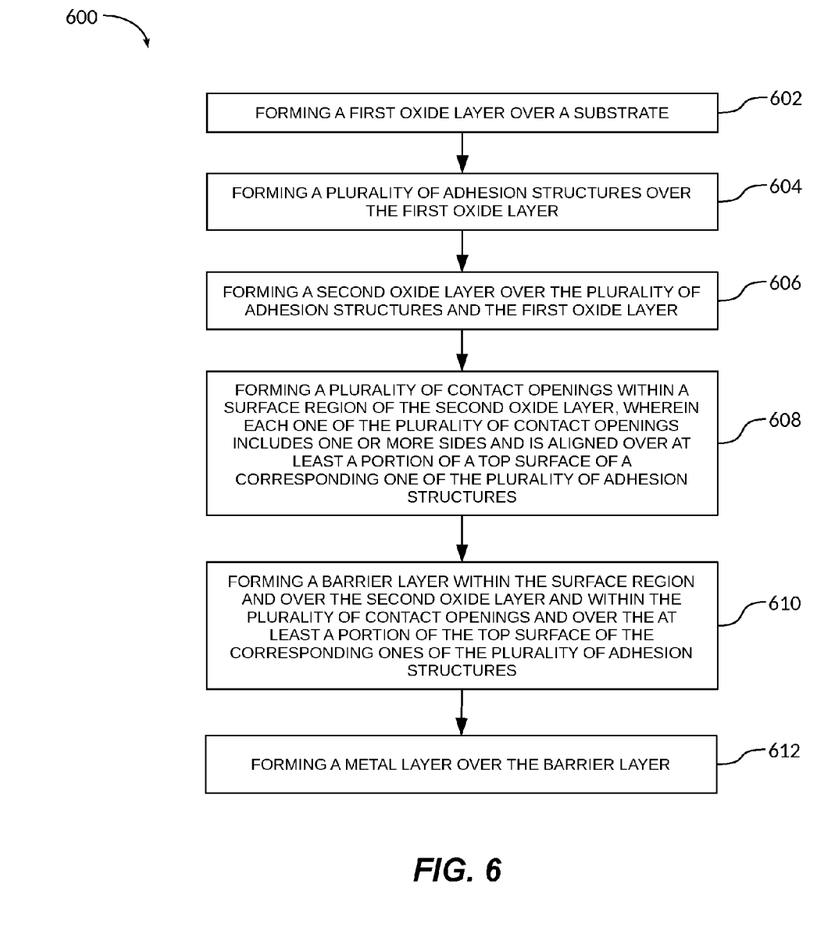
FIG. 6 illustrates a flowchart of an embodiment of a method for forming a bond pad structure.

FIG. 6 illustrates a flowchart of an embodiment of a method for forming a bond pad structure 100. The method is illustrated at 600. At 602, a first oxide layer 103 is formed over a substrate 102. At 604, a plurality of adhesion structures 116 are formed over first oxide layer 103. In one embodiment, the plurality of adhesion structures 116 comprise polysilicon. In other embodiments, adhesion structures 116 can be formed from other suitable materials or combinations of materials. In one embodiment, forming the plurality of adhesion structures 116 over first oxide layer 103 comprises each one of the plurality of adhesion structures 116 being spaced apart at a distance 142 from adjacent ones of the plurality of adhesion structures 116 in one or more directions that are parallel to the surface region 136. In one embodiment, forming the plurality of adhesion structures 116 comprises forming the plurality of adhesion structures 116 to have a ratio of an area of a surface region to an area of the plurality of adhesion structures 116 that is within a range of about 3 to about 1000. In the embodiment illustrated in FIG. 4, the area of the surface region of bond pad 400 is equal to a product of the first distance (136a-136b) and the second distance (436a-436b). In one embodiment, forming the plurality of adhesion structures 116 over the first oxide layer 103 comprises forming one or more device gates 216 over a gate oxide 204 that overlies substrate 102. In one embodiment, the device gates 216 and the adhesion structures 116 are formed from a same polysilicon layer. At 606, a second oxide layer 104 is formed over the plurality of adhesion structures 116 and the first oxide layer 103. In one embodiment, forming second oxide layer 104 over the plurality of adhesion structures 116 and first oxide layer 103 comprises forming device oxide 204 over one or more device gates 204. In one embodiment, device oxide 204 and second oxide 104 are formed from a same oxide layer. At 608, a plurality of contact openings 106 are formed within a surface region 136 of second oxide layer 104. Each one of the contact openings 106 includes one or more sides 108 (illustrated at 108a and 108b) and is aligned over at least a portion of top surface 140 of a corresponding adhesion structure 116. At 610, a barrier layer 120 is formed within surface region 136. In one embodiment, barrier layer 120 is a conformal barrier layer 120. In the illustrated embodiment, barrier layer 120 is formed over second oxide layer 104 and within the plurality of contact openings 106 and over at least a portion of the top surface 140 of the corresponding ones of the plurality of adhesion structures 116. In various embodiments, barrier layer 120 can be formed from any suitable material or any combination of suitable materials that includes, but is not limited to, Ti, TiN, W, TiW, Ta, TaN, TiSiN, TaSiN, WN, Nb, Mo, MoN, Cr, Co, Ni, Pd, Pt and any combination or derivative of these materials. In other embodiments, other suitable materials or combinations of suitable materials may be used. In other embodiments, barrier layer 120 includes two or more layers of suitable materials. For example, in one embodiment, barrier layer 120 is formed from Ti and TiN and is a Ti/TiN barrier layer. At 612, a metal layer 122 is formed over barrier layer 120.

In one embodiment, metal layer 122 is a conformal metal layer 122. In the illustrated embodiment, metal layer 122 can be formed from any suitable material or alloys of materials that include, but is not limited to, Al, Au, Ag, Cu, W, Cr, Ti, Pt, Pd, and any combination or derivative of these materials. In other embodiments, metal layer 122 can be formed from other suitable materials or combinations of materials.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A bond pad structure, comprising:
a first oxide layer that overlies a substrate;
at least three adhesion structures formed over the first oxide layer, wherein each one of the at least three adhesion structures is spaced apart from adjacent ones of the at least three adhesion structures in at least a first direction and a second direction, wherein the first direction and the second direction are parallel to a surface region of the first oxide layer, and wherein the at least three adhesion structures comprise polysilicon;
a second oxide layer formed over the at least three adhesion structures and the first oxide layer, wherein each one of at least three contact openings formed within a surface region of the second oxide layer includes one or more sides and is aligned over at least a portion of a top surface of a corresponding one of the at least three adhesion structures;
a barrier layer formed within the surface region and over the second oxide layer and within the at least three contact openings, wherein the barrier layer is formed over and is conformal to the at least a portion of the top surface of the corresponding ones of the at least three adhesion structures; and
a conformal metal layer formed over the barrier layer and having a structured surface, wherein the structured surface conforms to the at least three contact openings and includes a surface level of the conformal metal layer that is over the barrier layer between adjacent ones of the at least three contact openings that is greater than the surface level of the conformal metal layer that is over the barrier layer and within the at least three contact openings.

2. The bond pad structure of claim 1, wherein the barrier layer comprises a material selected from a group of materials consisting of Ti, TiN, W, TiW, Ta, TaN, TiSiN, TaSiN, WN, Nb, Mo, MoN, Cr, Co, Ni, Pd, Pt and any combination or derivative of these materials.

3. The bond pad structure of claim 1, wherein the metal layer comprises a material selected from a group of materials consisting of Al, Au, Ag, Cu, W, Cr, Ti, Pt, Pd and any combination or derivative of these materials.

4. The bond pad structure of claim 1, wherein a ratio of an area of the surface region to an area of the at least three adhesion structures is within a range of about 3 to about 1000.

5. A bond pad structure, comprising:
a first oxide layer that overlies a substrate;
a plurality of adhesion structures formed over the first oxide layer;
a second oxide layer formed over the plurality of adhesion structures and the first oxide layer, wherein each one of a plurality of contact openings formed within a surface region of the second oxide layer includes one or more sides and is aligned over at least a portion of a top surface of a corresponding one of the plurality of adhesion structures;
a barrier layer formed within the surface region and over the second oxide layer and within the plurality of contact openings and over the at least a portion of the top surface of the corresponding ones of the plurality of adhesion structures;
a metal layer formed over the barrier layer; and
one or more device gates that are each formed over a gate oxide that overlies the substrate, wherein the one or more device gates and the plurality of adhesion structures are formed from a same polysilicon layer.

6. A bond pad structure, comprising:
a first oxide layer that overlies a substrate;
a plurality of adhesion structures formed over the first oxide layer;
a second oxide layer formed over the plurality of adhesion structures and the first oxide layer, wherein each one of a plurality of contact openings formed within a surface region of the second oxide layer includes one or more sides and is aligned over at least a portion of a top surface of a corresponding one of the plurality of adhesion structures;
a barrier layer formed within the surface region and over the second oxide layer and within the plurality of contact openings and over the at least a portion of the top surface of the corresponding ones of the plurality of adhesion structures;
a metal layer formed over the barrier layer; and
one or more device gates that are each formed over a gate oxide that overlies the substrate, wherein the one or more device gates and the plurality of adhesion structures are formed from a same polysilicon layer, wherein the one or more device gates each comprise a device oxide formed thereover, and wherein the device oxide and the second oxide are formed from a same oxide layer.

7. A bond pad structure, comprising:
at least three recesses arranged within a surface region of an oxide layer that overlies a substrate, each one of the at least three recesses including one or more sides and a bottom that is at a depth below a surface of the oxide layer, wherein each one of the at least three recesses is spaced apart from adjacent ones of the at least three recesses in at least a first direction and a second direction, and wherein the first direction and the second direction are parallel to the surface region of the oxide layer;
an adhesion layer formed over the bottom of the at least three recesses and having a thickness that is less than the depth, wherein the adhesion layer comprises polysilicon;
a barrier layer formed over the surface region and within the at least three recesses, wherein the barrier layer is formed over and is conformal to the adhesion layer; and
a conformal metal layer formed over the barrier layer and having a structured surface, wherein the structured surface conforms to the at least three recesses and includes a surface level of the conformal metal layer that is over the barrier layer between adjacent ones of the at least three recesses that is greater than the surface level of the conformal metal layer that is over the barrier layer and within the at least three recesses.

8. The bond pad structure of claim 7, wherein the barrier layer comprises a material selected from a group of materials consisting of Ti, TiN, W, TiW, Ta, TaN, TiSiN, TaSiN, WN, Nb, Mo, MoN, Cr, Co, Ni, Pd, Pt and any combination or derivative of these materials.

9. The bond pad structure of claim 7, wherein the metal layer comprises a material selected from a group of materials consisting of Al, Au, Ag, Cu, W, Cr, Ti, Pt, Pd and any combination or derivative of these materials.

10. The bond pad structure of claim 7, wherein a ratio of an area of the surface region to an area of the adhesion layer over the bottom of the plurality of recesses is within a range of about 3 to about 1000.

11. A method of forming a bond pad structure, comprising:
forming a first oxide layer over a substrate;
forming at least three adhesion structures over the first oxide layer, wherein each one of the at least three adhesion structures is spaced apart from adjacent ones of the at least three adhesion structures in at least a first direction and a second direction, wherein the first direction and the second direction are parallel to a surface region of the first oxide layer, and wherein the at least three adhesion structures comprise polysilicon;
forming a second oxide layer over the at least three adhesion structures and the first oxide layer;
forming at least three contact openings within a surface region of the second oxide layer, wherein each one of the at least three contact openings includes one or more sides and is aligned over at least a portion of a top surface of a corresponding one of the at least three adhesion structures;
forming a barrier layer within the surface region and over the second oxide layer and within the at least three contact openings, wherein the barrier layer is formed over and is conformal to the at least a portion of the top surface of the corresponding ones of the at least three adhesion structures; and
forming a conformal metal layer over the barrier layer that has a structured surface, wherein the structured surface conforms to the at least three contact openings and includes a surface level of the conformal metal layer that is over the barrier layer between adjacent ones of the at least three contact openings that is greater than the surface level of the conformal metal layer that is over the barrier layer and within the at least three contact openings.

12. The method of claim 11, wherein the barrier layer comprises a material selected from a group of materials consisting of Ti, TiN, W, TiW, Ta, TaN, TiSiN, TaSiN, WN, Nb, Mo, MoN, Cr, Co, Ni, Pd, Pt and any combination or derivative of these materials.

13. The method of claim 11, wherein the metal layer comprises a material selected from a group of materials consisting of Al, Au, Ag, Cu, W, Cr, Ti, Pt, Pd and any combination or derivative of these materials.

14. The method of claim 11, wherein a ratio of an area of the surface region to an area of the plurality of adhesion structures is within a range of about 3 to about 1000.

15. A method of forming a bond pad structure, comprising:
- forming a first oxide layer over a substrate;
- forming a plurality of adhesion structures over the first oxide layer;
- forming one or more device gates over a gate oxide that overlies the substrate, wherein the one or more device gates and the plurality of adhesion structures are formed from a same polysilicon layer;
- forming a second oxide layer over the plurality of adhesion structures and the first oxide layer;
- forming a plurality of contact openings within a surface region of the second oxide layer, wherein each one of the plurality of contact openings includes one or more sides and is aligned over at least a portion of a top surface of a corresponding one of the plurality of adhesion structures;
- forming a barrier layer within the surface region and over the second oxide layer and within the plurality of contact openings and over the at least a portion of the top surface of the corresponding ones of the plurality of adhesion structures; and
- forming a metal layer over the barrier layer.

16. A method of forming a bond pad structure, comprising:
- forming a first oxide layer over a substrate;
- forming a plurality of adhesion structures over the first oxide layer;
- forming one or more device gates over a gate oxide that overlies the substrate;
- forming a second oxide layer over the plurality of adhesion structures and the first oxide layer;
- forming a device oxide over the one or more device gates, wherein the device oxide and the second oxide are formed from a same oxide layer;
- forming a plurality of contact openings within a surface region of the second oxide layer, wherein each one of the plurality of contact openings includes one or more sides and is aligned over at least a portion of a top surface of a corresponding one of the plurality of adhesion structures;
- forming a barrier layer within the surface region and over the second oxide layer and within the plurality of contact openings and over the at least a portion of the top surface of the corresponding ones of the plurality of adhesion structures; and
- forming a metal layer over the barrier layer.

* * * * *